(12) United States Patent
Kauranen et al.

(10) Patent No.: US 8,004,836 B2
(45) Date of Patent: Aug. 23, 2011

(54) ARRANGEMENT FOR A MOTOR CONTROLLER

(75) Inventors: Matti Kauranen, Espoo (FI); Mika Silvennoinen, Espoo (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 12/722,743

(22) Filed: Mar. 12, 2010

(65) Prior Publication Data

US 2010/0232106 A1    Sep. 16, 2010

(30) Foreign Application Priority Data

Mar. 13, 2009   (FI) ..................................... 20095265

(51) Int. Cl.
*H05K 7/20* (2006.01)
(52) U.S. Cl. ........ 361/690; 361/688; 361/695; 361/699; 361/704; 361/707; 165/80.3
(58) Field of Classification Search .................. None
See application file for complete search history.

(56) References Cited

U.S. PATENT DOCUMENTS

| | | | |
|---|---|---|---|
| 3,149,666 A * | 9/1964 | Coe ............................. | 165/121 |
| 3,277,346 A | 10/1966 | McAdam et al. | |
| 5,586,004 A * | 12/1996 | Green et al. ................. | 361/699 |
| 5,930,112 A * | 7/1999 | Babinski et al. ............. | 361/695 |
| 6,493,227 B2 * | 12/2002 | Nielsen et al. ............... | 361/703 |
| 6,580,608 B1 * | 6/2003 | Searls et al. ................. | 361/690 |
| 6,992,890 B2 * | 1/2006 | Wang et al. .................. | 361/700 |
| 7,148,452 B2 * | 12/2006 | Peterson et al. ........... | 219/443.1 |
| 7,315,450 B2 * | 1/2008 | Ishii et al. .................... | 361/704 |
| 7,646,606 B2 * | 1/2010 | Rytka et al. .................. | 361/704 |
| 7,878,686 B2 * | 2/2011 | Suehiro et al. ............... | 362/294 |
| 2003/0117772 A1 | 6/2003 | Searls et al. | |
| 2003/0123227 A1 * | 7/2003 | Chin-Wen .................... | 361/697 |
| 2005/0286226 A1 | 12/2005 | Ishii et al. | |
| 2009/0284923 A1 | 11/2009 | Rytka et al. | |

FOREIGN PATENT DOCUMENTS

| | | |
|---|---|---|
| DE | 101 40 328 A1 | 4/2003 |
| DE | 10 2005 031 759 | 1/2007 |

OTHER PUBLICATIONS

European Search Report dated Sep. 28, 2010, issued in the corresponding European Application No. 10156044.9-1242.
*Finnish Search Report for FI 20095265 dated Oct. 26, 2009.

* cited by examiner

*Primary Examiner* — Boris L Chervinsky
(74) *Attorney, Agent, or Firm* — Buchanan Ingersoll & Rooney PC

(57) ABSTRACT

An arrangement is disclosed for a motor controller, the arrangement including a number of power semiconductors and cooling elements, the cooling elements being connected to the power semiconductors for cooling them. The power semiconductors and the cooling elements are disposed around a center axis of the arrangement in such a manner that they demark a channel around the center axis from at least three sides, to which channel cooling surfaces of the cooling elements extend and in which the cooling medium is able to flow in the direction of the center axis, and the power semiconductors extend from the connections between the power semiconductors and the cooling elements substantially away from the center axis. The arrangement can further include at least one choke disposed in the channel demarked around the center axis.

20 Claims, 4 Drawing Sheets

ARRANGEMENT FOR A MOTOR CONTROLLER

RELATED APPLICATIONS

This application claims priority under 35 U.S.C. §119 to Finnish Patent Application No. 20095265 filed in Finland on Mar. 13, 2009, the entire content of which is hereby incorporated by reference in its entirety.

FIELD

The disclosure relates to an arrangement for a motor controller.

BACKGROUND INFORMATION

An inverter is an electrical device enabling generation of a voltage with a variable frequency. One example of an inverter is a converter bridge implemented by IGB transistors (IGBT, Insulated-gate Bipolar Transistor) or other power semiconductors. Inverters have been used in connection with motors for controlling them with a variable frequency or, correspondingly, when electrical power is transmitted back to the network, whereby the inverter generates a voltage with a frequency that corresponds to the frequency of the network. Such an inverter feeding the network is referred to as a network inverter.

An inverter may also be a part of a frequency converter used for controlling a motor or another load, for example. Known frequency converters are formed of two converters, (e.g., a rectifier and an inverter) between which there is a direct-voltage or direct-current intermediate circuit. The rectifier and the inverter may also be positioned physically separated from each other and one rectifier may feed several inverters via a common intermediate circuit or, alternatively, several rectifiers may feed one inverter. An example of a rectifier is a diode bridge or a thyristor bridge.

Frequency converters can also include one or more choke devices. Examples of such choke devices used in or in connection with frequency converters include an input choke connected to the input of the rectifier of the frequency converter, and an output choke connected to the output of the inverter of the frequency converter.

Frequency converter structures presently in use include an input choke, an input bridge, a capacitor bank and an IGBT module. A structure-specific electrical circuit may also contain a brake power module (brake chopper) and an output choke (e.g. LC, LCL or LCR connection). Up to protection class IP20 (Ingress Protection), mechanical devices are constructed with one blower, in which the main flow of cooling medium, such as air, is conveyed to the cooling element of the power semiconductors and to other objects by the kind of distribution they use. The cooling element can, as a rule, be a one-part or a multi-part element, the parts being bunched together with support mechanics.

In protection class IP21 or in higher protection classes, the electronics space (what is called clean room) and the space for the cooling element (what is called dirty room) are separated from each other for practical reasons. In order for both spaces to have the right amount of air, both spaces can be provided with a blower of its own. The possible input choke can be positioned on the dirty side, either in a separate air space or in the space following the cooling element. Alternatively, the possible AC input choke may also be replaced by a DC choke connected to the intermediate circuit but in this case, too, the mechanical position of the choke is in the same place. The possible structure-specific output choke can be positioned mechanically in the same place as the input choke. In some structures, the possible chokes are positioned completely outside the device, in which case they can be, due to the cooling and their own support mechanism, larger in size than they would be if integrated.

Known inverter and frequency converter structures or motor controller structures can be problematic, for example, with regard to arranging the cooling. Although the size of the cooling element or elements has continuously been on the decrease owing to more accurate designing, smaller losses and physically smaller power semiconductors, the amount of air (or amount of another cooling medium) relative to the outer dimensions of the device has even increased. Also, distribution of a sufficient amount of air can be, for example, performed using a large blower at a low blasting rate, taking into account the power, sound and service life of the blower. For this reason, the space used by the cooling is, relative to the size of the device, rather large in known solutions. This is further emphasized in, for example, IP21 or higher protection classes.

SUMMARY

An arrangement for a motor controller is disclosed, the arrangement comprising: plural power semiconductors and cooling elements, the cooling elements being connected to the power semiconductors for cooling; a center axis about which the power semiconductors and the cooling elements are disposed to demark a channel around the center axis from at least three sides; cooling surfaces of the cooling elements which extend to the center axis, the channel being configured for a cooling medium to flow in a direction of the center axis, with the power semiconductors extending from the connections between the power semiconductors and the cooling elements substantially away from the center axis; and at least one choke disposed in the channel demarked around the center axis.

A motor controller is disclosed, comprising: plural power semiconductors connected to generate a desired voltage; cooling elements connected to the power semiconductors for cooling; a center axis about which the power semiconductors and the cooling elements are disposed to demark a channel around the center axis from at least three sides; cooling surfaces of the cooling elements which extend to the center axis, the channel being configured for a cooling medium to flow in a direction of the center axis, with the power semiconductors extending from the connections between the power semiconductors and the cooling elements substantially away from the center axis; and at least one choke disposed in the channel demarked around the center axis.

BRIEF DESCRIPTION OF THE DRAWINGS

The disclosure will now be described in greater detail in connection with exemplary embodiments, referring to the attached drawings, of which.

DETAILED DESCRIPTION

An exemplary arrangement is disclosed wherein power semiconductors and cooling elements associated with them are disposed around a center axis of the arrangement such that they demark a channel around the center axis from at least three sides, to which channel cooling surfaces of the cooling elements extend and in which a cooling medium is able to flow in the direction of the center axis. Further, the disclosure is based on the idea that the arrangement comprises at least one choke disposed in the channel demarked around the center axis.

An exemplary structure according to the disclosure can provide a natural channel for the flow of the cooling medium, which can enable controlled circulation of the cooling medium, such as air, through the device and thus also controlled cooling of one or more chokes disposed in the channel. Owing to this, the cooling can be implemented efficiently while saving space at the same time. Further, an exemplary arrangement of the disclosure allows the cooling to be implemented uniformly in different parts of the device. Furthermore, exemplary solutions according to the disclosure enable a modular structure, which can provide advantages for the production and maintenance of a device as disclosed herein, for example.

The disclosure can be applied in connection with various motor controller solutions and is thus not restricted to be used in connection with any particular type of device. The term 'motor controller' refers, in this context, generally to any device applicable to controlling a motor, such as to an inverter, frequency converter, rectifier or soft starter, the disclosure being not limited to these examples, however. Any type of the motor controller feed and/or load controlled by the controller or the connections between them, such as the voltage level or the number of phases, can be used in conjunction with the basic idea of the disclosure. Further, internal and/or external electrical connections of the motor controller in connection with which the disclosure will be readily apparent from the disclosure, so the electrical connections are, for the sake of clarity, omitted from the figures. The disclosure is not confined to the examples shown in the figures but may be applied to other types of motor controller solutions as well.

Figure 1:
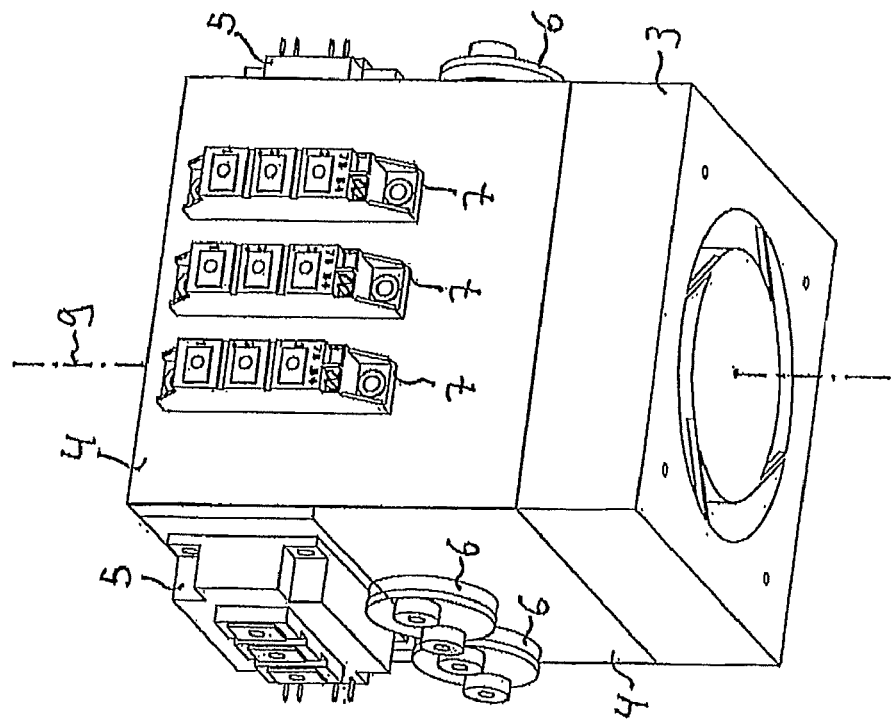
FIG. 1 shows an arrangement according to an exemplary embodiment, seen from two different directions.
Figure 1:
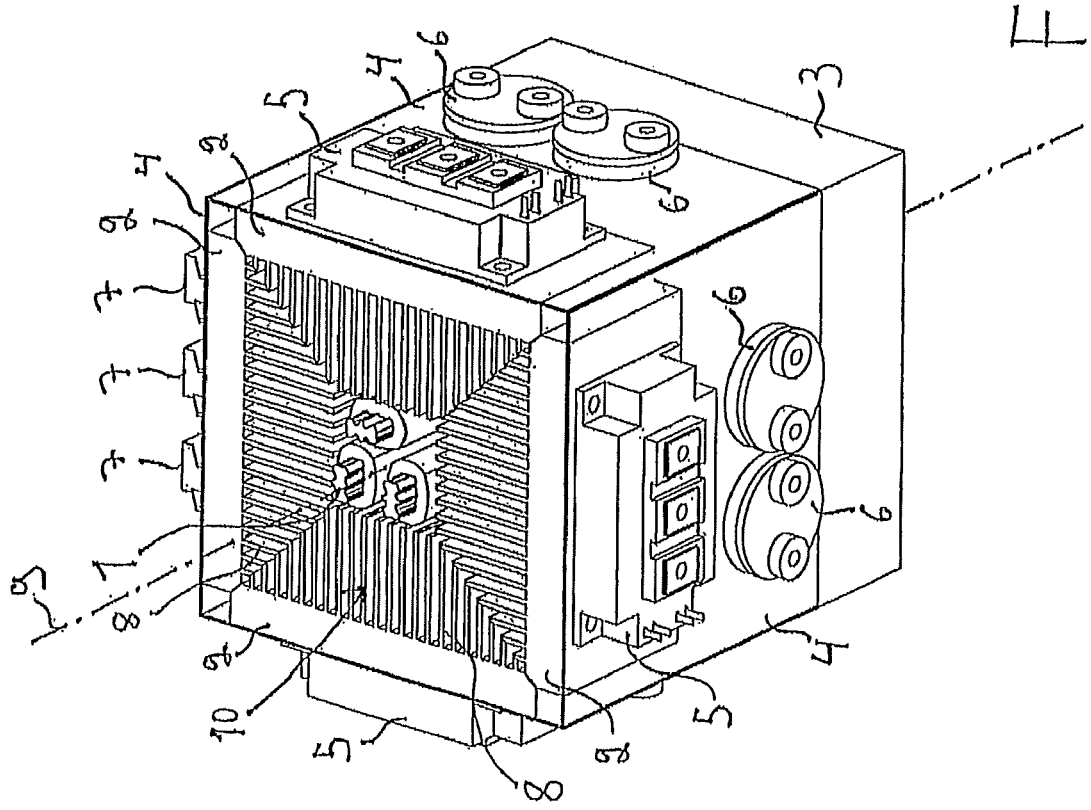

FIG. 1 shows a perspective view of an arrangement according to an exemplary embodiment, seen from two different directions. The arrangement shown in FIG. 1 includes a number of power semiconductors 5 and 7 and cooling elements 2 connected to them. In accordance with the disclosure, the power semiconductors 5 and 7 as well as the cooling elements 2 are disposed around a center axis 9 of the arrangement in such a manner that cooling surfaces 8 of the cooling elements extend from the connections between the power semiconductors 5 and 7 and the cooling elements 2 substantially towards the center axis 9, and the power semiconductors 5 and 7 extend from the connections between the power semiconductors and the cooling elements substantially away from the center axis 9 in such a manner that a channel 10 is demarked around the center axis from at least three sides, in which channel the cooling surfaces 8 of the cooling elements are located and in which the cooling medium is able to flow in the direction of the center axis 9.

Figure 2:
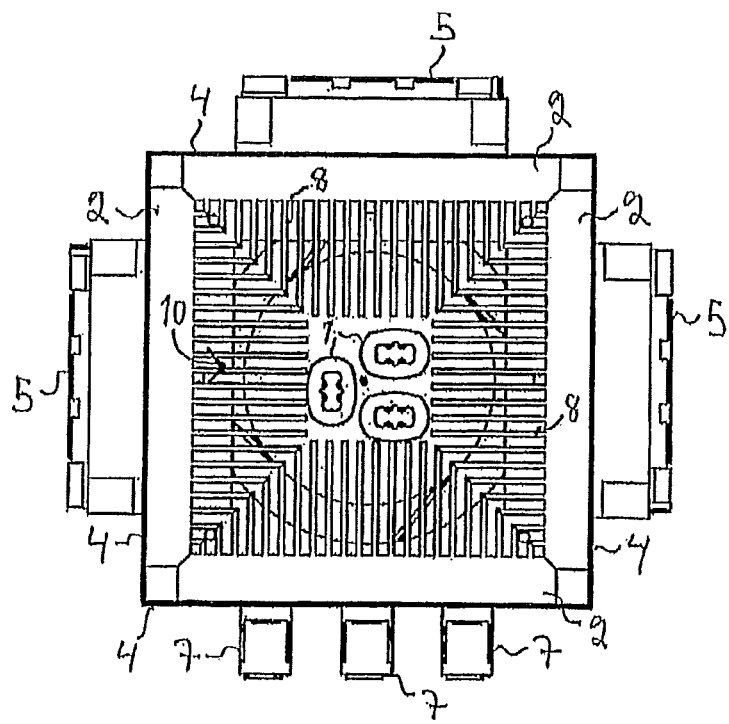
FIG. 2 shows an arrangement according to an exemplary embodiment.

In the exemplary arrangement of FIG. 1, the channel 10 demarked around the center axis 9 is demarked from four sides, and the channel 10 is, seen in the direction of the center axis, substantially square, which is illustrated in FIG. 2, where the same system is shown in the direction of the center axis 9. One of the four sides could also be open. The channel 10 is thus not necessarily accurately demarked from all sides but, for example, a channel demarked from three sides may be sufficient to guide the passage of the cooling medium, such as air, in the direction of the center axis 9. It is also possible for the channel 10 to be substantially triangular, or of any other desired shape, seen in the direction of the center axis 9.

The power semiconductors 5 and 7 are, for example, divided into three or more groups, whereby there is at least one cooling element 2 associated with each group. The exemplary arrangement of FIG. 1 includes three power semiconductor groups 5 of which, according to an exemplary embodiment, each includes at least two power semiconductor switches. For example, the groups 5 may be IGBT modules, each having two IGB transistors, whereby three of such groups 5 include (e.g., consist of) two IGB transistors which form a three-phase alternator. The arrangement of the example in FIG. 1 can further include a power semiconductor group formed of three diode modules 7. The diode modules 7 can include, for example, two diodes each, whereby three of the modules 7 with two diodes form a three-phase rectifier, for example. The arrangement may further include at least one capacitor 6 positioned at least partly in the channel 10. The example of FIG. 1 includes six capacitors 6, for example intermediate circuit capacitors extending to the channel 10, in which the flowing cooling medium thus cools the capacitors 6 as well.

Figure 5:
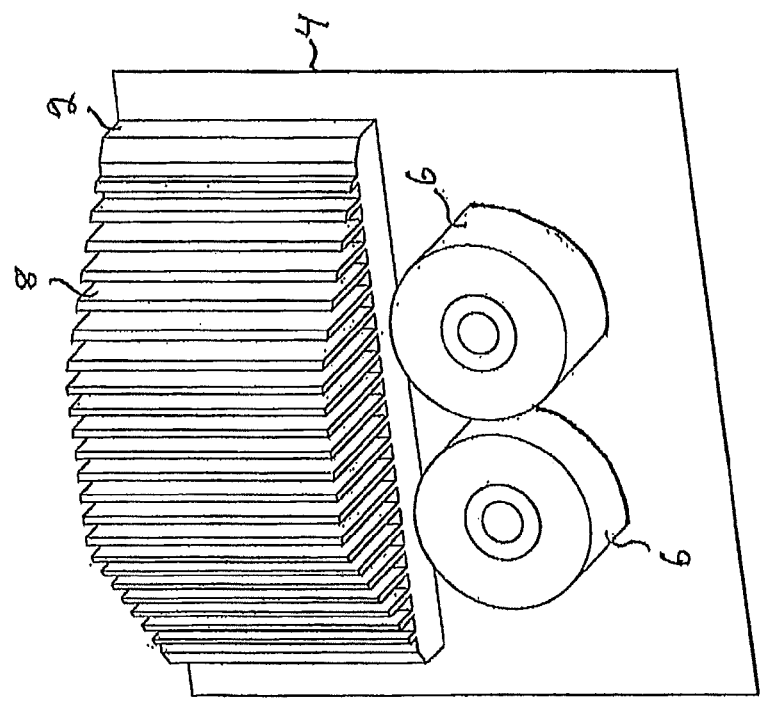
FIG. 5 shows a modular structure associated with an arrangement according to an exemplary embodiment, seen from two different directions.
Figure 5:
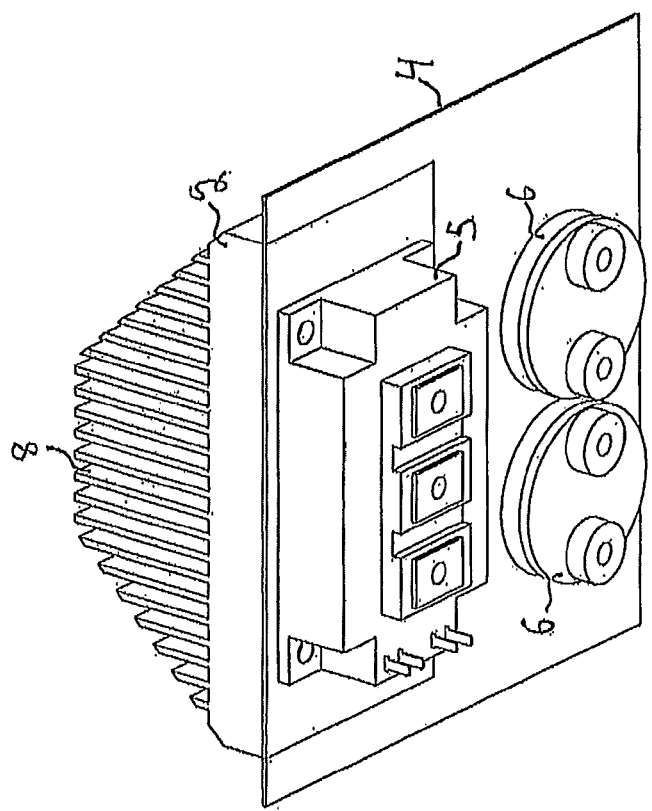

Each power semiconductor group is, for example, connected to a plate-like structure 4 in such a way that the power semiconductors of each group extend outwards from one surface of the plate-like structure 4, and the cooling surfaces 8 of at least one cooling element 2 corresponding to the group extend outwards from the opposite surface of the plate-like structure. The plate-like structure 4 may be formed of a continuous plate or a plurality of group-specific plates attached to each other. The material of the plate-like structure may be of sheet metal or other suitable plate material. The material or materials used can, for example, be selected according to any specifications and/or requirements of the object of application. The plate-like structure 4 may also serve as a support structure for the whole structure, whereby the whole structure can also be assembled using the support structure. In an alternative with a plurality of plates, the structure may be formed of modules in accordance with the example of FIG. 5, the modules having one or more plates 4 as well as a cooling element 2 and a power semiconductor group 5 attached to it. Further, capacitors 6, for example, may be attached to the plate 4. A desired number of such modules shown in FIG. 5, for instance three or four, may be attached to each other to form a structure according to FIG. 1. The plate-like structure 4 may be formed of a separate plate or plates or it may be a part of one or more cooling elements 2. Thus, for example the plate 4 and the cooling element 2 shown in the example of FIG. 5 may be formed of a continuous structure or separate parts attached to each other. Possible separate parts can be attached to each other by soldering, a screw joint, separate support structures, for example, or in any other suitable and appropriate manner. The exact manner of attachment can be selected and implemented by those skilled in the art, and need not be further disclosed herein. The channel demarked around the center axis 9 may be demarked by means of the plate-like structure 4.

According to an exemplary embodiment, the channel 10 demarked around the center axis 9 can be substantially triangular when seen in the direction of the center axis, (e.g., the outermost contour of the channel 10, demarked for instance by the plate-like structure 4 and/or the cooling elements 2, can be mainly triangular). Thus, a group 5 or 7 of power semiconductors as well as at least one cooling element 2 associated with the group are, for example, disposed on each side of the triangle. This embodiment is suitable, for example, for implementing an inverter in such a way that at least one group 5 of IGB transistors, thyristors or other power semiconductors are disposed on each side of the triangle.

According to another exemplary embodiment, the channel 10 demarked around the center axis 9 can be substantially square when seen in the direction of the center axis (e.g., the outermost contour of the channel 10, demarked for instance by the plate-like structure 4 and/or the cooling elements 2, can be mainly square), and a group of power semiconductors as well as at least one cooling element associated with the group are, for example, disposed on at least three sides of the square. For example, a group 5 of power semiconductors can be positioned on three sides of the square, and a group of power semiconductors 7 forming a rectifier can be positioned on one side of the square. The example of FIG. 1 shows a structure according to this embodiment. Further, the arrangement may include at least one choke 1 disposed in the channel 10 demarked around the center axis 9. The at least one choke may be an air-core choke. Further, the at least one choke 1 may be an input choke and/or an output choke. Aluminum or copper cooling elements 2, for example, do not react much to the magnetic flux of the choke 1. Thus, support structures 4 and outer casings of the cooling elements 2 can be, for example, as far from the choke 1 as possible, so that the magnetic flux caused by the choke 1 cannot disturb external devices or the motor controller's own electronics.

In addition, possible heating in the support structures, caused by the magnetic flux, can be taken care of by the cooling medium flow directly or indirectly via the cooling elements 2. If desired, it is also possible to construct a mechanical support for the choke 1 as well as a magnetic return flux in the vicinity of the choke because such support structures are in a space cooled extremely well and, if desired, heat generated in them can be conducted off by using the same cooling elements 2. Then, the end of the cooling elements 2 on the side of the choke, not very relevant to the cooling of the power semiconductors 5 and 7, becomes utilized, such that the thermal efficiency of the cooling elements 2 can be improved. The mechanical structure of the choke 1 can also inhibit or prevent, if desired, EMC interference caused by the magnetic flux to the rest of the electronics and to the outside of the device. Further, the plate structure 4 can also serve as EMC protection, which is also efficiently cooled to the air channel.

According to an exemplary embodiment, the arrangement can include one or more blowers 3 for circulating cooling medium in the channel 10. The cooling medium may be gaseous medium, such as air, or liquid cooling medium. The channel 10 formed in the structure can facilitate providing the structure with a blower 3 that is located naturally in relation to the cooling medium flow circulating through the channel, for instance in the manner shown in FIG. 1. The blower 3 may either blast cooling medium into the channel 10 or suck cooling medium out of the channel 10. It is also possible to connect the channel 10 formed in the structure to an air flow channel or the like, possibly present in the device to which the disclosure is applied.

Figure 3:
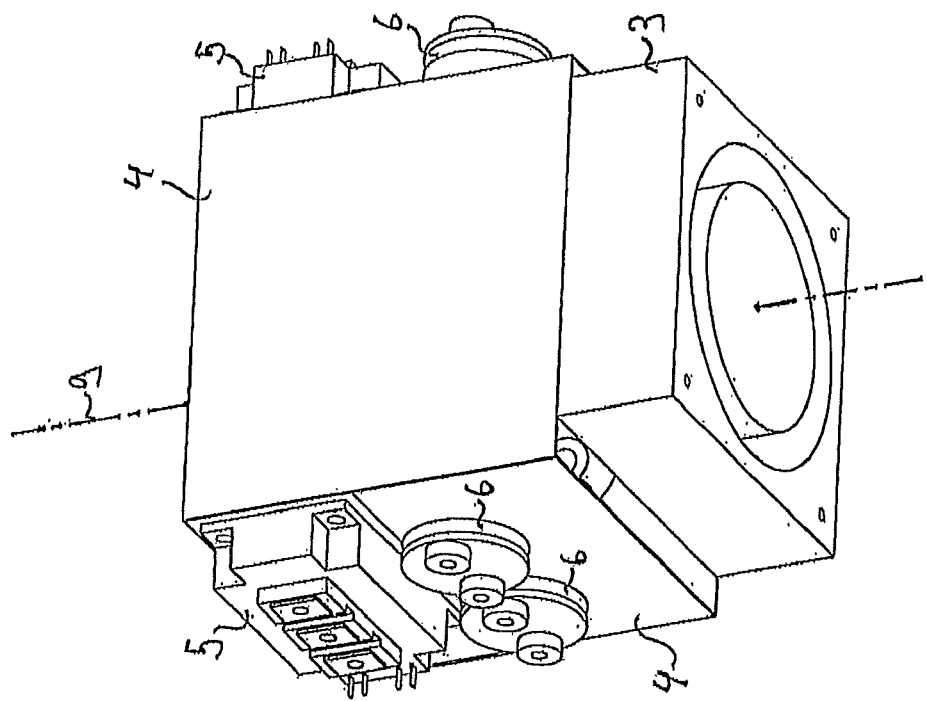
FIG. 3 shows an arrangement according to an exemplary embodiment, seen from two different directions.
Figure 3:
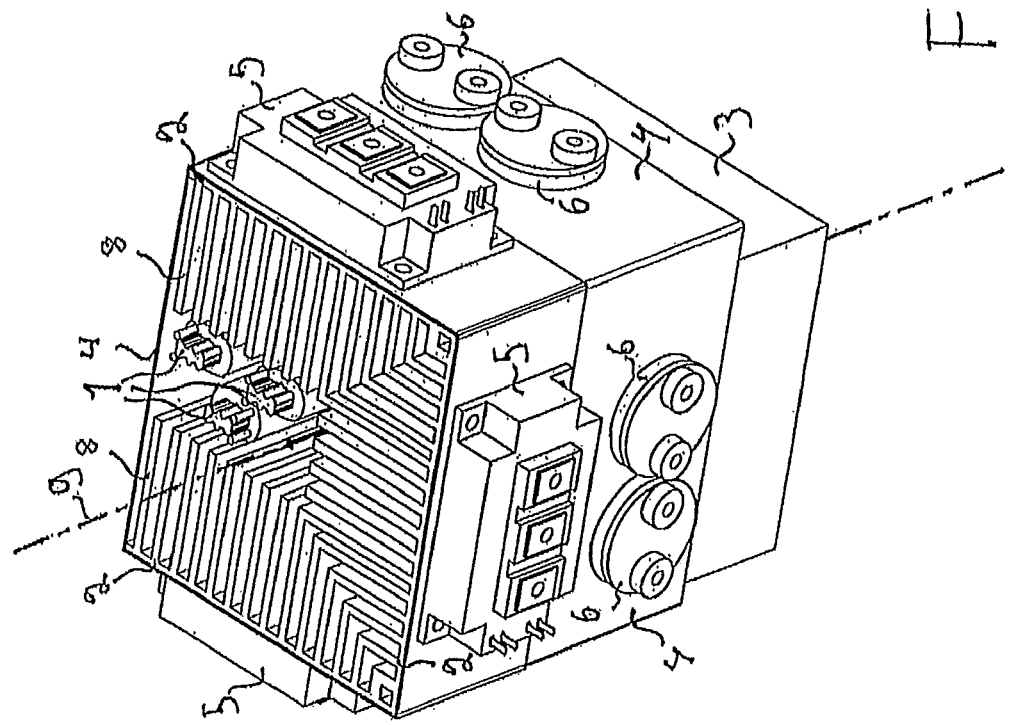

FIG. 3 shows a perspective view of an exemplary arrangement in accordance with an embodiment, seen from two different directions. The arrangement shown in FIG. 3 corresponds, for the most part, to the arrangement described in connection with FIG. 1, but the arrangement of FIG. 3 does not include a rectifier formed of diode modules. There is a plate-like support structure 4 on one side of the channel 10 (or the side has been left open). The structure can be suitable for use as the structure of a separate inverter or rectifier, for example. Further, in the example of FIG. 3, the cooling element 2 can be formed of a continuous element. Separate elements could also be used, as in FIG. 1. Likewise, the support structure 4 of FIG. 3 may be continuous or formed of separate parts. In FIG. 3, the choke 1 may be, for example, a choke implemented with an LC, LCL or LCR connection.

Figure 4:
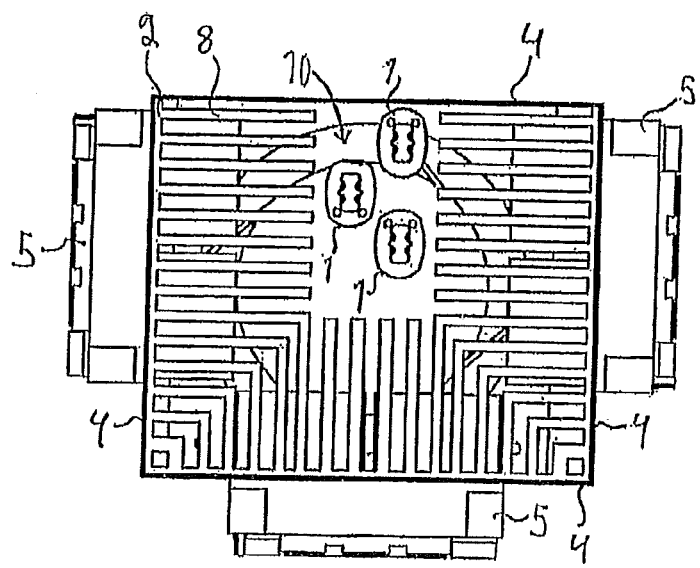
FIG. 4 shows an arrangement according to an exemplary embodiment.

In FIG. 4, the exemplary arrangement of FIG. 3 is shown in the direction of the center axis 9 to illustrate the structure.

It is further to be noted that, for the sake of clarity, many parts possibly present in the device utilizing the disclosure have been omitted from the figures associated with the above examples. The mechanical attachment of the structure is shown in a very reduced manner in the figures. For the sake of simplicity, the mechanical and electrical connections of the semiconductor modules 5 and 7 to each other and the electrical connections of the modules to, for example, chokes 1 and user interfaces, implementable in several alternative ways, have been omitted from the figures. It is to be mentioned that, for example, a low-inductance busbar system between the IGB transistors 5 and the capacitors 6 can be easily implementable in the module shown in FIG. 5, for instance. Likewise, the control cards (e.g. what is called a gatedriver, not shown) of the modules according to FIG. 5 and other electrical parts possibly associated with the module as well as the mechanics desired by them can be easily implemented.

Within the embodiments described above or in addition to them, the structure according to the disclosure may be used in a plurality of additional embodiments. The structure according to the disclosure may be utilized not only for implementing the basic structure of an inverter, rectifier or frequency converter but also for implementing an input bridge or brake chopper of a frequency converter, for example. An input bridge may be implemented in such a way, for example, that instead of IGBT modules 5 there are three input bridge modules. The brake chopper, in turn, may be implemented in such a way that the IGBT modules 5 are replaced by simpler brake components when the rectifier module is empty. A brake chopper can use LC and/or LR circuits to even out DC voltage peaks. This circuit or some of its components may naturally be positioned in place of the choke 1. Alternatively, the place of the choke 1 can be empty, or a brake resistor may be put in place of it. The electrical values (e.g., voltage, power, capacitance and inductance of the capacitors) of the module shown in FIG. 5 may naturally vary even to a significant extent. The choke 1 may also deviate from what is shown in FIG. 1. The choke 1 may have a yoke instead of an air core. Its shape may also be oblong or, for example, toroid or any other suitable, desired shape. The shape of an air-core choke may also be different from what is shown in the figures, or it may be formed of several different parts.

The number of chokes may also be different from three shown in the figures. However, the number of chokes is, for example, divisible by three due to the three-phase current or, when a DC choke is concerned, divisible by two due to the direct current.

The cooling element 2 shown in the figures may, in practice, have almost any shape and its material may also vary. The cooling element 2 may have one part or be formed of separate cooling elements positioned in power semiconductors. For example, a cooling element can be made of inexpensive metal materials with good thermal conductivity, such as aluminum or copper. The structure according to the disclosure is excellent not only for air cooling but also for liquid cooling. Then, the blower 3 is not necessarily needed at all. Alternatively, an air-liquid heat exchanger may be mounted upon the device in a natural upper space formed by the cooling elements. Water pipes may also be integrated in the same cooling element, whereby the device functions either by means of an air blower or alternatively by means of liquid.

When utilized in connection with various electrical components, an exemplary mechanical structure according to the disclosure can work optimally in a lot wider area than present structures. Owing to this, the structure according to the disclosure can enable implementation of modularity through the whole device/series of devices, such as a frequency converter, involving not only one device but also its internal structures (e.g. power unit, choke unit, blower unit, control unit). Modularity in this sense may be considered to refer to standardizing the attachment points of each internal unit. Exemplary advantages obtained in this way for the manufacture may be significant.

When implemented according to different embodiments, exemplary structure according to the disclosure can provide a plurality of advantages. For example, when aluminum or copper cooling elements are used, the possible choke 1 may be an air-core choke having a small size and low manufacturing costs. Thanks to its position, the magnetic flux of the choke does not heat the surrounding metal structures, nor does it disturb the functioning of the other electrical components (such as circuit boards). If desired, it is easy to construct covers for the choke because the temperature rise can be eliminated by means of a blower and, if desired, by means of cooling elements. The cooling of the structure is optimal because the position of the possible blower 3 relative to the capacitors 6, cooling elements 2 and chokes 1 is natural. Further, the structure can enable the use of a large, low-power blower with a long service life.

The IP class of the device for which the structure of the disclosure is utilized can be selected according to the protection desired in each particular case. The center of the structure constitutes a dirty side, while the electronics space can be designed around it on a clean side. Further, the structure provides good premises for cooling the electronics space with natural convection because the conductive losses from power semiconductors to the electronics space can be distributed substantially symmetrically, and the surface of convection to the center of the device (in the channel 10) and to the outside of the device can be, for example, at least four-fold or even over eight-fold compared with known structures.

In addition, owing to its symmetry and modularity, exemplary structures according to the disclosure can be easily repaired, on the condition that it is first pulled out of its mounting place. It is easy to assemble an exemplary device for which a structure as disclosed herein is utilized, and it is also simple to phase it by using a rotation jig or a vertical position. Thanks to its modularity, a unit utilizing a structure disclosed herein can be, if desired, separately tested or checked, whereby the defects can be observed more quickly. Further, the modularity can provides advantages of large-scale production. The overall size of the device for which the structure according to the disclosure is utilized can be small and, owing to the optimal cooling and the large-scale production enabled by modularity, its manufacturing costs can be low.

It will be apparent to those skilled in the art that as the technology advances, basic ideas of the disclosure may be implemented in a plurality of different ways. The disclosure and its embodiments are not restricted to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An arrangement for a motor controller, the arrangement comprising:
   plural power semiconductors and cooling elements, the cooling elements being connected to the power semiconductors for cooling;
   a center axis about which the power semiconductors and the cooling elements are disposed to demark a channel around the center axis from at least three sides;
   cooling surfaces of the cooling elements which extend to the channel around the center axis, the channel being configured for a cooling medium to flow in a direction of the center axis, with the power semiconductors extending from the connections between the power semiconductors and the cooling elements substantially away from the center axis; and
   at least one choke disposed in the channel demarked around the center axis.

2. The arrangement of claim 1, wherein the power semiconductors are divided into at least three groups, whereby there is at least one cooling element associated with each group.

3. The arrangement of claim 2, wherein the arrangement comprises:
   three groups, each of which include at least two power semiconductor switches.

4. The arrangement of claim 2, comprising:
   a plate-like structure attached to each group such that the power semiconductors of each group extend outwards from one surface of the plate-like structure, and the cooling surface of at least one cooling element extends outwards from an opposite surface of the plate-like structure.

5. The arrangement of claim 4, wherein the plate-like structure is formed of at least one of a continuous plate, and plural group-specific plates attached to each other.

6. The arrangement of claim 5, wherein the plate-like structure delimits the channel demarked around the center axis from at least three sides, seen in the direction of the center axis.

7. The arrangement of claim 4, wherein the plate-like structure is a part of said at least one cooling element.

8. The arrangement of claim 2, wherein the channel demarked around the center axis is, seen in the direction of the center axis, substantially triangular and a group of power semiconductors and at least one cooling element associated with the group are arranged on each side of the triangle.

9. The arrangement of claim 2, wherein the channel demarked around the center axis is, seen in the direction of the center axis, substantially square and a group of power semiconductors and at least one cooling element associated with the group are positioned on at least three sides of the square.

10. The arrangement of claim 9, comprising:
    a group of power semiconductors positioned on three sides of the square, and a group of power semiconductors forming a rectifier positioned on one side of the square.

11. The arrangement of claim 10, wherein the group of power semiconductors forming the rectifier comprises diodes.

12. The arrangement of claim 1, wherein said at least one choke is an air-core choke.

13. The arrangement of claim 1, wherein said at least one choke is an input choke and/or an output choke.

14. The arrangement of claim 1, wherein the cooling medium is at least one of a gaseous and a liquid cooling medium.

15. The arrangement of claim 1, comprising:
at least one blaster for circulating the cooling medium in said channel.

16. The arrangement of claim 15, wherein the cooling medium is air.

17. The arrangement of claim 1, comprising:
at least one capacitor positioned at least partly in said channel.

18. A motor controller, comprising:
plural power semiconductors;
cooling elements connected to the power semiconductors for cooling;
a center axis about which the power semiconductors and the cooling elements are disposed to demark a channel around the center axis from at least three sides;
cooling surfaces of the cooling elements which extend to the channel around the center axis, the channel being configured for a cooling medium to flow in a direction of the center axis, with the power semiconductors extending from the connections between the power semiconductors and the cooling elements substantially away from the center axis; and
at least one choke disposed in the channel demarked around the center axis.

19. The motor controller of claim 18, wherein the motor controller is at least one of an inverter, a rectifier, a frequency converter and a soft starter.

20. An arrangement for a motor controller, the arrangement comprising a number of power semiconductors and cooling elements, the cooling elements being connected to the power semiconductors for cooling them, wherein:
the power semiconductors and the cooling elements are disposed around a center axis of the arrangement in such a manner that they demark a channel around the center axis from at least three sides, to which channel cooling surfaces of the cooling elements extend and in which a cooling medium is able to flow in the direction of the center axis,
the power semiconductors extend from the connections between the power semiconductors and the cooling elements substantially away from the center axis, and wherein:
the arrangement further comprises at least one choke disposed in the channel demarked around the center axis.

* * * * *